US009261798B2

(12) United States Patent
Huang et al.

(10) Patent No.: US 9,261,798 B2
(45) Date of Patent: Feb. 16, 2016

(54) LITHOGRAPHIC APPARATUS AND DEVICE MANUFACTURING METHOD

(71) Applicant: ASML Netherlands B.V., Veldhoven (NL)

(72) Inventors: Yang-Shan Huang, Veldhoven (NL); Theodorus Petrus Maria Cadee, Asten (NL)

(73) Assignee: ASML Netherlands B.V., Veldhoven (NL)

( * ) Notice: Subject to any disclaimer, the term of this patent is extended or adjusted under 35 U.S.C. 154(b) by 319 days.

(21) Appl. No.: 13/871,328

(22) Filed: Apr. 26, 2013

(65) Prior Publication Data

US 2013/0314684 A1 Nov. 28, 2013

Related U.S. Application Data

(60) Provisional application No. 61/650,708, filed on May 23, 2012.

(51) Int. Cl.
 *G03F 7/20* (2006.01)

(52) U.S. Cl.
 CPC ........ *G03F 7/70725* (2013.01); *G03F 7/70758* (2013.01)

(58) Field of Classification Search
 CPC ............ G03F 7/70725; G03F 7/70758; G03F 7/70775; G03F 7/709; H02K 41/03; H02K 16/00; H02K 41/0354
 USPC .................. 355/53, 72, 75; 310/12.05, 12.06
 See application file for complete search history.

(56) References Cited

U.S. PATENT DOCUMENTS

| 7,442,476 | B2 * | 10/2008 | Best et al. ........................ 430/22 |
| 2004/0083966 | A1 * | 5/2004 | Takahashi et al. ............. 118/715 |
| 2005/0007569 | A1 * | 1/2005 | Streefkerk et al. .............. 355/30 |
| 2005/0259233 | A1 * | 11/2005 | Streefkerk et al. .............. 355/53 |
| 2006/0098176 | A1 | 5/2006 | Gui et al. |
| 2006/0187437 | A1 * | 8/2006 | Emoto ........................... 355/72 |
| 2007/0236854 | A1 * | 10/2007 | Lee et al. ...................... 361/143 |
| 2008/0067968 | A1 * | 3/2008 | Binnard et al. ............... 318/687 |
| 2010/0227277 | A1 * | 9/2010 | Aoki ............................. 430/319 |
| 2010/0266961 | A1 * | 10/2010 | Kawamura et al. ........... 430/319 |
| 2011/0042874 | A1 | 2/2011 | Aoki et al. |

FOREIGN PATENT DOCUMENTS

| EP | 1 664 587 B1 | 11/2010 |
| JP | 2001-313241 A | 11/2001 |

OTHER PUBLICATIONS

English-Language Abstract for Japanese Patent Publication No. 2001-313241 A, published Nov. 9, 2001; 1 page.

* cited by examiner

*Primary Examiner* — Steven H Whitesell Gordon
(74) *Attorney, Agent, or Firm* — Sterne, Kessler, Goldstein & Fox P.L.L.C.

(57) ABSTRACT

A substrate stage is used in a lithographic apparatus. The substrate stage includes a substrate table constructed to hold a substrate and a positioning device for in use positioning the substrate table relative to a projection system of the lithographic apparatus. The positioning device includes a first positioning member mounted to the substrate table and a second positioning member co-operating with the first positioning member to position the substrate table. The second positioning member is mounted to a support structure. The substrate stage further comprises an actuator that is arranged to exert a vertical force on a bottom surface of the substrate table at a substantially fixed horizontal position relative to the support structure.

15 Claims, 7 Drawing Sheets

LITHOGRAPHIC APPARATUS AND DEVICE MANUFACTURING METHOD

CROSS REFERENCE TO RELATED APPLICATIONS

This application is related to and incorporates by reference herein in its entirety U.S. Provisional Application No. 61/650,708.

BACKGROUND

1. Field of the Present Invention

The present invention relates to a substrate stage, a lithographic apparatus and a method for manufacturing a device.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. In such stepper or scanner arrangements, an accurate positioning of the substrate relative to the irradiated pattern (provided by a projection system) is required. An accurate positioning is required in both the horizontal plane (in order to assure an accurate match between successive layers of the integrated circuit) and in vertical position (relative to the projection system, in order to assure that the target portion is in focus). In order to accurately position the substrate relative to the projection system a positioning device is provided, enabling to control a position of the substrate in 6 degrees of freedom. In view of an increase in the accuracy requirements for the positioning of the substrate relative to the patterned radiation beam, more complex positioning devices have been designed. Such devices can e.g., include an overdetermined number of actuators in order to take account of e.g., deformations of substrate tables holding the substrate. It is expected that meeting the overlay and focus requirements will become more and more difficult, in particular when a transition is made towards larger wafers or substrates, such as 450 mm wafers. Further, external disturbances as e.g., caused by liquid containing devices that are used in immersion lithographical apparatuses may further hinder an accurate positioning, in particular with respect to focusing of a substrate.

SUMMARY

It is desirable to provide a substrate stage or lithographical apparatus that enables a more accurate positioning of a substrate, in particular a more accurate vertical positioning of a target portion relative to a projection system.

According to an embodiment, there is provided a substrate stage for use in a lithographic apparatus. The substrate stage comprising a substrate table constructed to hold a substrate and a positioning device for in use positioning the substrate table relative to a projection system of the lithographic apparatus. The positioning device comprising a first positioning member mounted to the substrate table and a second positioning member co-operating with the first positioning member to position the substrate table. The second member being mounted to a support structure. The substrate stage further comprises an actuator, the actuator being arranged to exert a vertical force on a bottom surface of the substrate table at a substantially fixed horizontal position relative to the support structure.

In another embodiment of the present invention, there is provided a lithographic apparatus comprising a support constructed to support a patterning device, the patterning device being capable of imparting a radiation beam with a pattern in its cross-section to form a patterned radiation beam, a substrate table constructed to hold a substrate, and a projection system configured to project the patterned radiation beam onto a target portion of the substrate. The apparatus further comprises a positioning device for in use positioning the substrate table relative to the projection system. The positioning device comprising a first positioning member mounted to the substrate table and a second positioning member co-operating with the first positioning member to position the substrate table. The second member being mounted to a support structure. The substrate stage further comprises an actuator, the actuator being arranged to exert a vertical force on a bottom surface of the substrate table at a substantially fixed horizontal position relative to the projection system.

In yet another embodiment, there is provided a device manufacturing method comprising positioning a substrate relative to a projection system and projecting a patterned beam of radiation onto a target portion of the substrate. The positioning the substrate comprises providing a positioning device comprising a first positioning member mounted to the substrate table and a second positioning member co-operating with the first positioning member to position the substrate table; the second positioning member being mounted to a support structure. Exerting a vertical force on a bottom surface of the substrate table at a substantially fixed horizontal position relative to an optical axis of the projection system.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the present invention and to enable a person skilled in the relevant art(s) to make and use the present invention.

Figure 1:
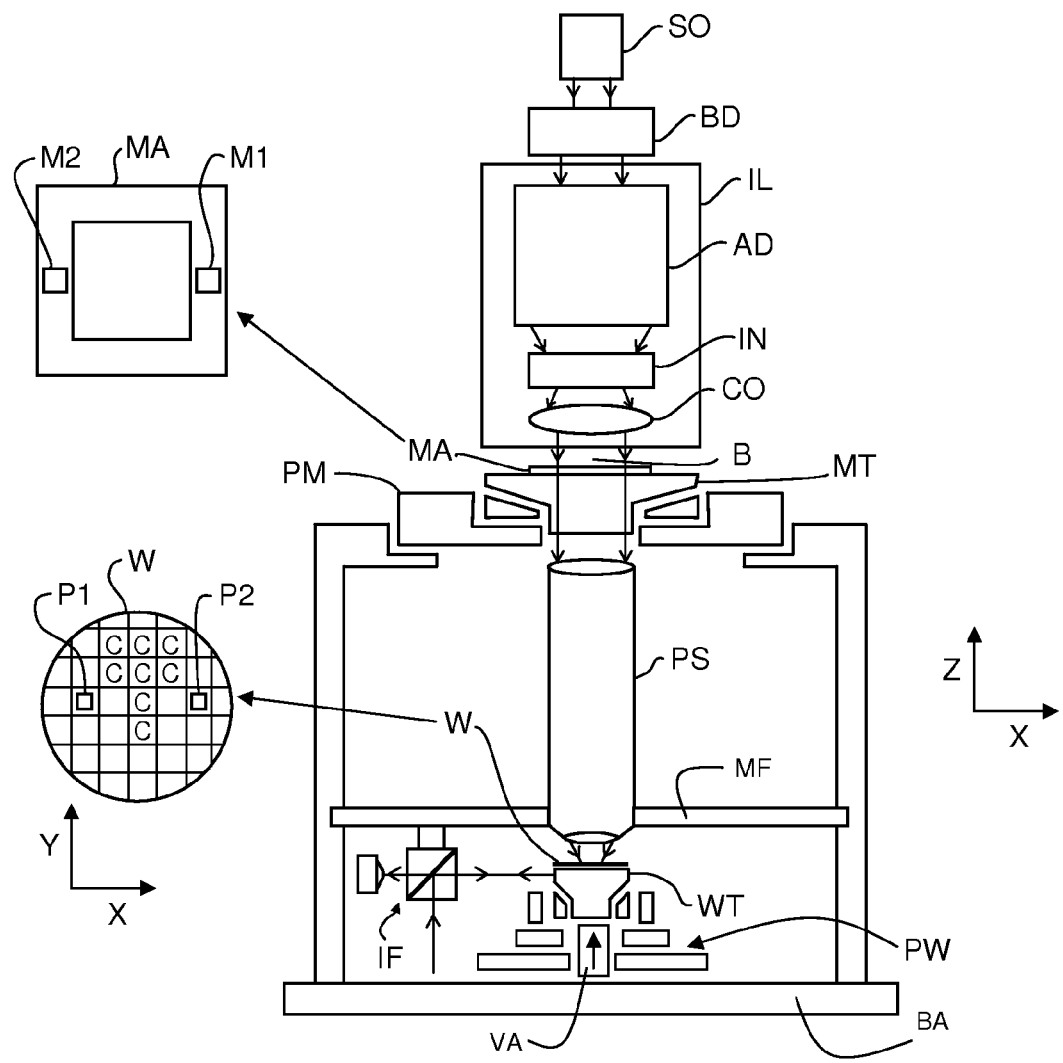
FIG. 1 depicts a lithographic apparatus according to an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts a lithographic apparatus according to one embodiment of the present invention. The apparatus includes an illumination system (illuminator) IL configured to condition a radiation beam B (e.g., UV radiation or any other suitable radiation), a mask support structure (e.g., a mask table) MT constructed to support a patterning device (e.g., a mask) MA and connected to a first positioning device PM configured to accurately position the patterning device in accordance with certain parameters. The apparatus also includes a substrate table (e.g., a wafer table) WT or "substrate support" constructed to hold a substrate (e.g., a resist-coated wafer) W and connected to a second positioning device PW configured to accurately position the substrate in accordance with certain parameters. The apparatus further includes a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. In the arrangement as shown, the projection system PS is mounted to a metrology frame MF which can be isolated (with respect to vibrations) from a base BA of the apparatus. With the aid of the second positioning device PW and position sensor IF (e.g., an interferometric device, linear encoder or capacitive sensor), the substrate table WT can be moved accurately, e.g., so as to position different target portions C in the path of the radiation beam B. Typically, such position sensor or position measurement system (or components thereof) are mounted to the metrology frame MF. Similarly, the first positioning device PM and another position sensor (which is not explicitly depicted in FIG. 1) can be used to accurately position the mask MA with respect to the path of the radiation beam B, e.g., after mechanical retrieval from a mask library, or during a scan.

In accordance with the present invention, an actuator VA is provided that is arranged to exert a vertical force on a bottom surface of the substrate table (WT) at a substantially fixed horizontal position relative to the projection system (PS). In an embodiment, the horizontal position at which the vertical force is exerted on the wafer table is on an optical axis of the projection system. By providing the actuator at the substantially fixed position relative to the projection system, the substrate, or more specifically the target portion of the substrate that is directly underneath the patterned radiation beam can be brought into focus more easily. Further on, the target portion of the substrate that is directly underneath the patterned radiation beam is also referred to as the 'point of interest'. As will be understood by the skilled person, in order to obtain an accurate projection of the patterned radiation beam onto the target portion, the target portion or point of interest should be in focus. In a conventional positioning device, several actuators may be provided to enable a vertical displacement of the substrate or a tilting of the substrate. Typically, these actuators are not in a stationary position relative to the projection system; they are often mounted to a so-called long-stroke module of the positioning device.

In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioning device PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e., a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e., a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
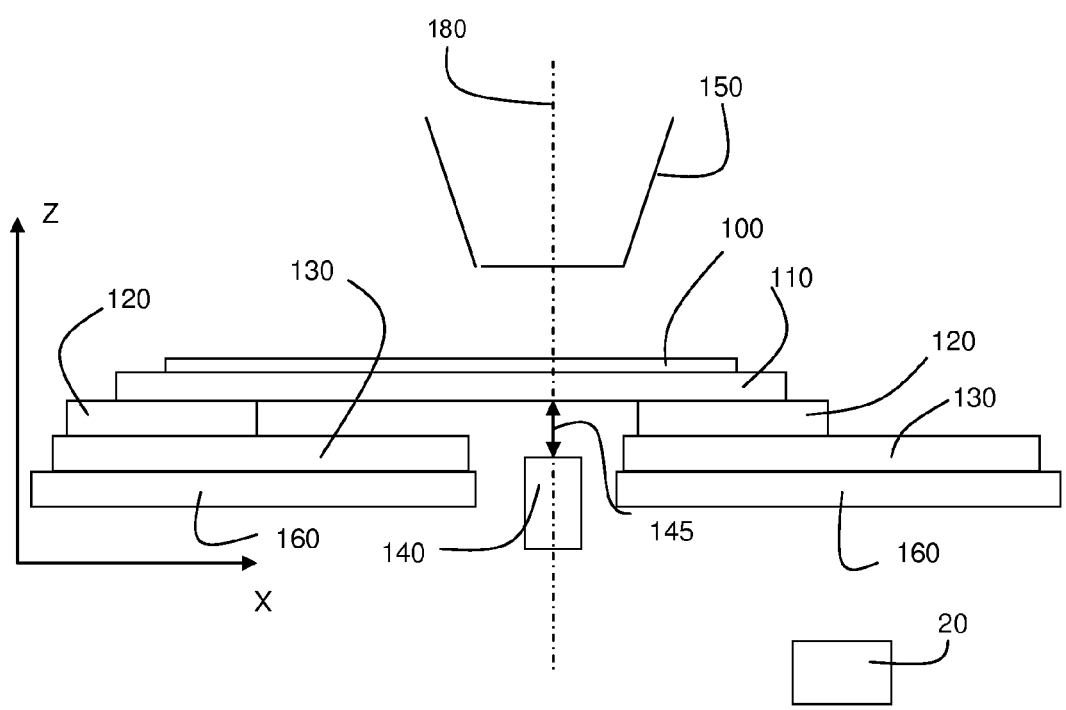
FIG. 2 depicts a first embodiment of a substrate stage according to the present invention.

In FIG. 2, a substrate stage according to an embodiment of the present invention is schematically shown. The stage comprises a substrate table (or chuck) 110 for holding a substrate 100. The substrate stage further comprises a positioning device (120,130) for positioning the substrate table 110. Such a positioning device can be similar to the positioning device PW as discussed above. The positioning device comprises a first positioning member 120 co-operating with a second positioning member 130 for positioning the substrate table. In order to realize such positioning, the first positioning member 120 can e.g., comprise a plurality of coils, arranged in a 1D or 2D pattern, whereas the second positioning member 130 can comprise a 1D or 2D pattern of alternatingly polarized permanent magnets. As such, the positioning device (120, 130) can, in an embodiment, provide in a positioning in a direction or a plane substantially perpendicular to the indicated Z-direction. Note that, alternatively, the plurality of coils may also be provided on the second positioning member 130 while the first positioning member 120 is provided with the permanent magnets. In such arrangement, the positioning member provided with the coils can remain substantially stationary. By properly energizing the coils of the first or second positioning member, a vertical repelling force may also be exerted between the first and second positioning member. In such case, the positioning device can be referred to as a magnetically levitated planar (or linear) motor. In such arrangement, no bearing such as an air bearing is required to separate the first positioning member from the second positioning member in the Z-direction. In the arrangement as shown, the second positioning member 130 is mounted to a support structure 160. Such a support structure 160 can be e.g. a base frame of a lithographic apparatus when the stage is mounted into such apparatus. The support structure can be directly mounted to a floor or bottom of such apparatus or for example via vibration isolators such as air mounts or the like. In accordance with the present invention, the substrate stage further comprises an actuator 140 arranged to exert a vertical force (indicated by the arrow 145) on a bottom surface of the substrate table 110. In accordance with the present invention, the actuator is arranged at a substantially fixed horizontal position relative to the support structure. As such, during displacement of the substrate table 110 (by operating the positioning device (120,130), the actuator is capable of exerting a vertical force on the substrate table (thus influencing a vertical position of the substrate 100) at a substantially fixed horizontal position, irrespective of the horizontal position of the substrate table or substrate. In an embodiment, when the stage is applied in a lithographical apparatus, the horizontal position of the actuator corresponds to the horizontal position of the point of interest, i.e., the target portion of the substrate 100 which is directly underneath the patterned radiation beam. In FIG. 2, the patterned radiation beam is schematically indicated by the central optical axis 180 of a projection system 150 of a lithographical apparatus. As such, the actuator 140 enables an actuation in the point of interest, i.e., at a position at which the substrate should be in focus with the patterned radiation beam.

In general, various forces are acting upon the substrate, such forces affecting the vertical position of the substrate in the point of interest. Such forces may include e.g., vertical forces exerted on the substrate table 110 by a further positioning device such as a short stroke actuator assembly (not shown) that is part of the first positioning member 120, or forces exerted by an immersion fluid (if present) between the substrate and the projection system.

Preferably, the actuator is arranged to apply a bi-directional force on the substrate table, thus enabling to both push the substrate table 110 upwards and pull the substrate table downwards, although actuators that can only exert either a (downwardly directed) pulling force or a (upwardly directed) pushing force should not be excluded. As an example of the former, a reluctance type actuator can be mentioned. More details on the various types of actuators that can be applied in accordance with the present invention are provided below. FIG. 2 further schematically shows a control unit 20 for controlling the force exerted by the actuator. In general, such control unit 20 will comprise an input terminal (not shown) for receiving an input signal representing a vertical position of the substrate table (e.g., obtained from a measurement system) and a set point representing a desired position of the substrate table. Based on such input, a control signal, e.g., representing a required current to be provided to the actuator, for the actuator can be determined.

In an embodiment of the present invention, the actuator 140 is mounted to the same support structure 160 as the second positioning member 130 of the positioning device (120,130). In such embodiment, the actuator 140 can either be mounted directly to the support structure or via a vibration isolator (not shown) such as an air mount or the like.

Alternatively, the actuator can be mounted on a separated frame that is isolated (with respect to vibrations) from the support structure supporting the positioning device. In a further alternative embodiment, the actuator can be mounted on a separated frame that is isolated comprising an inertial reference mass as, for example, disclosed in EP 1 664 587 B1, which document is hereby incorporated for reference. In a lithographical apparatus, such an isolated frame is often applied for supporting the projection system 150. In such arrangement, a position measurement system (or components thereof) is often mounted to such a frame which may thus be referred to as a metrology frame, see e.g., the position sensor IF and frame MF of FIG. 1.

In an embodiment of the present invention, the actuator 140 is mounted to such an isolated metrology frame of the lithographical apparatus.

Figure 3:
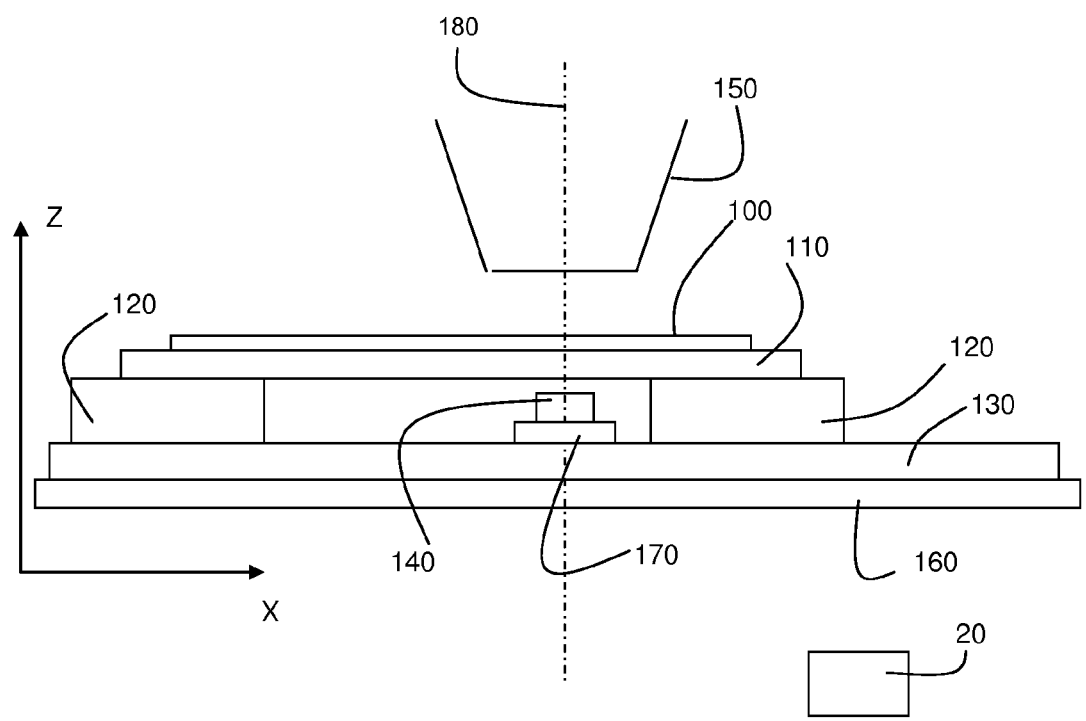
FIG. 3 depicts a second embodiment of a substrate stage according to the present invention.

Alternatively, the actuator 140 can be mounted to or supported by the second positioning member 130 of the positioning device. In FIG. 3, such an arrangement is schematically shown. In the arrangement as shown, the actuator 140 is mounted to the second positioning member 130 of the positioning device. In case the positioning member 130 has a substantially fixed position relative to the support structure 160, the actuator can be mounted directly (or via a vibration isolator) to the second position member 130. Often, the second positioning member 130 is displaceably mounted (e.g., via an air bearing) to the support structure 160, thereby operating as a so-called balance mass. In such arrangement, a reaction force (in reaction to a force exerted by the first positioning member 120 on the substrate table) acting on the second positioning member 130, may result in a displacement of the second positioning member 130 (in opposite direction as the displacement direction of the substrate table 110). As such, in order to maintain the actuator 140 in a substantially fixed horizontal position relative to the support structure 160, the actuator 140 can e.g., be mounted to a third positioning member 170, co-operating with the second positioning member 130 for positioning the actuator at the fixed horizontal position. In case the second positioning member 130 comprises an array (one-dimensional or two-dimensional) of permanent magnets, the third positioning member 170 can comprise a plurality of coils co-operating with the magnet array to position the actuator 140 mounted to the third positioning member 170.

Yet alternatively, the actuator 140 may also be displaceably mounted on the first positioning member 120, in a similar manner as shown in FIG. 3 with respect to the mounting on the second positioning member 130, such that it maintains a substantially fixed horizontal position relative to the support structure 160.

In an embodiment, the first positioning member 120 includes a further positioning device for providing an accurate positioning of the substrate stage. Such further positioning device is above referred to as a short stroke module and can e.g., comprises a plurality of actuators such as Lorentz actuators for positioning the substrate table 110.

In such arrangement, the further positioning device can e.g., be mounted underneath the substrate table 110 (see also further on), in which case the actuator 140 can be arranged to exert the vertical force to the substrate table via the further positioning device.

FIG. 3 further schematically depicts the control unit 20 as discussed above.

In accordance with the present invention, the actuator 140 (or the actuator VA as e.g., shown in FIG. 1) can comprise a plurality of actuators which are positioned around the point of interest.

Figure 4:
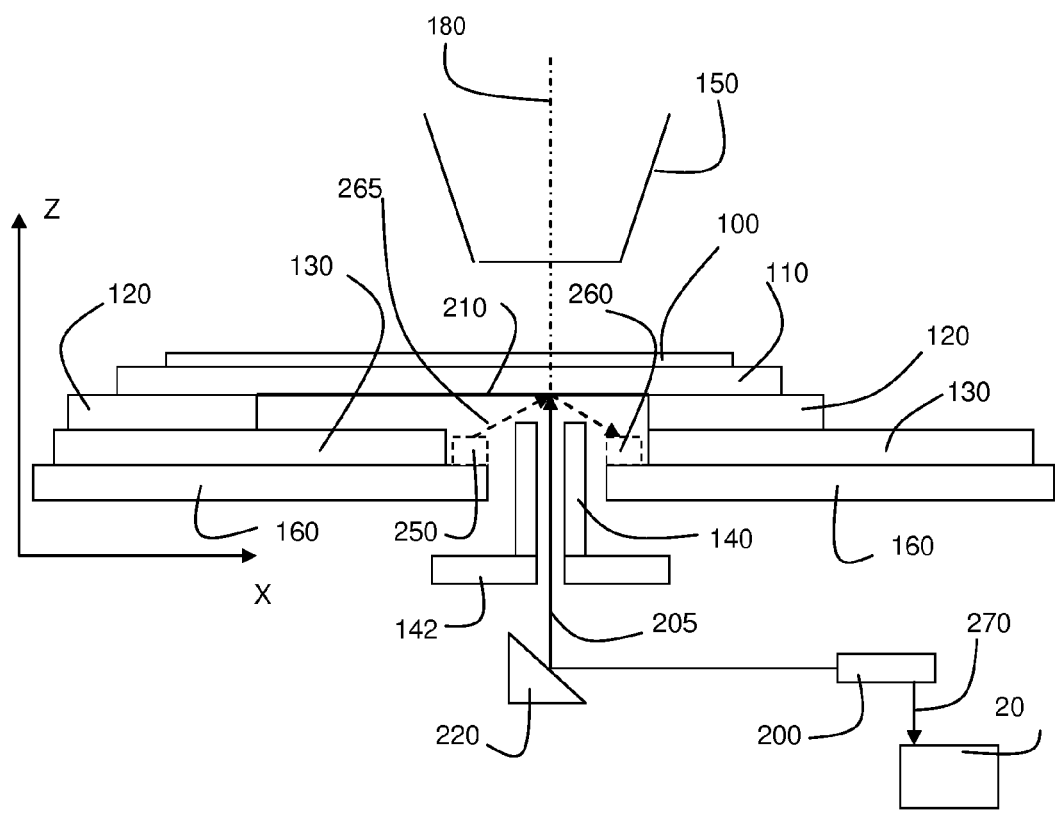
FIG. 4 depicts a third embodiment of a substrate stage according to the present invention.

In an embodiment, the substrate stage further comprises a measurement system for determining a vertical position of the bottom surface of the substrate stage. Such an arrangement is schematically shown in FIG. 4. In FIG. 4, a substrate stage having a similar layout as the stage of FIG. 2 is schematically shown. In addition to the arrangement of FIG. 2, a measurement system (an interferometer (IF) measurement system 200) is provided that is arranged to project a measurement beam 205 (via mirror 220) towards a reflective bottom surface 210 of the substrate table 110. In the arrangement as shown, the actuator 140 is provided with a central hole or aperture to enable the projection of the measurement beam 205 underneath the point of interest, i.e., the target portion of the substrate where the patterned radiation beam is projected. In the arrangement as shown, the actuator 140 is mounted to a vibration isolated frame 142. Alternatively, as indicated above, the actuator 140 may also be mounted (directly, or displaceably) to either the first positioning member 120 or the second positioning member 130. Note that other types of measurement systems may be equally be applied in order to determine a vertical position of the bottom surface of the substrate table. Examples of such systems are:
capacitive measurement systems;
encoder based measurement systems.

With respect to the latter, a grating can e.g., be mounted to the bottom surface of the substrate table, the grating co-operating with a sensor that is mounted to or near the actuator (or actuators) 140. Note that such arrangement may also be used to determine a horizontal position of the substrate table 110, e.g., relative to the projection system 150. In such arrangement, one or more sensors co-operating with the grating at the bottom surface of the substrate table can provide position signals on both the horizontal position of the substrate table (which can be used as a feedback signal in a control loop of the positioning device (120, 130) and the vertical position of the bottom surface of the substrate table (which can be used as a feedback signal in a control loop of the actuator 140). In such arrangement, the one or more sensors are preferable mounted to the same frame that supports the projection system, i.e., the metrology frame as referred to above. As mentioned, the actuator 140 may be mounted on the same frame or may be mounted on another structure (e.g., the support structure 160, the first positioning member 120 or the second positioning member 130).

As a further alternative measurement system, a vertical position of the bottom surface of the substrate table 110 can be determined in a similar manner as a height map of a substrate is determined. Such system (schematically indicated by a transmitter 250 and a sensor 260) can provide in a measurement beam 265 (transmitted by the transmitter 250) that is projected to the bottom surface at an incident angle <90° and reflected towards the sensor 260. In such arrangement, the transmitter and sensor 250, 260 can be mounted to the support structure 160 (as shown) or can be mounted to a metrology frame, e.g., a frame supporting the projection system. The transmitter and sensor 250, 260 may also be mounted to the isolated frame 142. In FIG. 4, the above discussed control unit 20 is further shown, whereby the control unit 20 is arranged to receive a input signal 270 from the measurement system 200, the input signal representing a vertical position of the substrate table 110.

In the following Figures, more detailed embodiments of actuators which can be applied in the present invention are schematically shown.

Figure 5A:
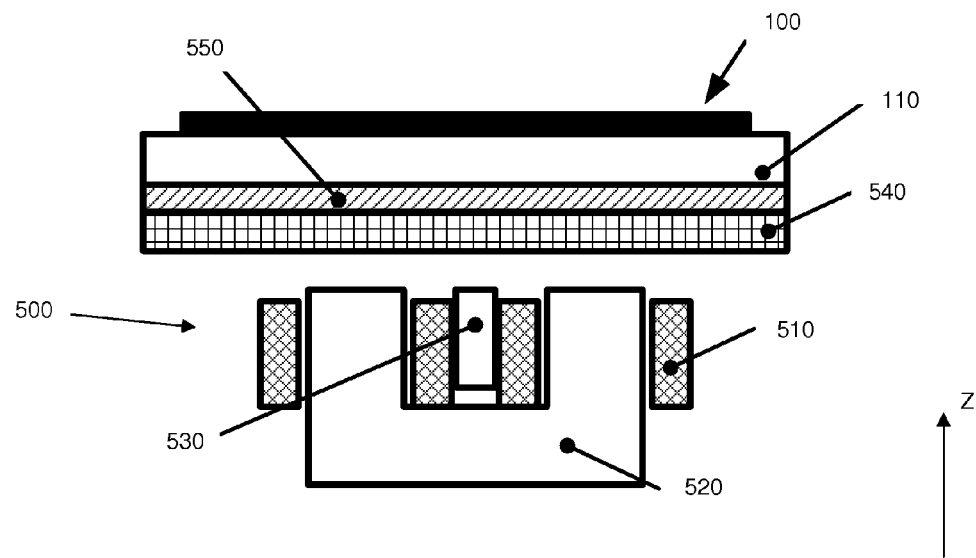
FIG. 5a depicts a first embodiment of an actuator as can be applied in a substrate stage or lithographical apparatus according to the present invention.

In FIG. 5a, a cross-sectional view of a reluctance type actuator is schematically shown, together with the substrate stage. FIG. 5a schematically shows a first actuator part 500 comprising a magnetic yoke (a C-core in the example shown) 520 and two coils 510 wound about legs of the magnetic yoke 520. As a second actuator part, a magnetic member 550 (e.g., a ferromagnetic plate) is provided, which is mounted to the substrate table 110, the substrate table being arranged to support a substrate 100. When the coils 510 are energized, an attractive force can be generated between the magnetic yoke 520 and the magnetic member 550, thus affecting the vertical position (Z-position) of the substrate table 110 and thus of the substrate 100. In the arrangement as shown, a position measurement system (530, 540) is incorporated for measuring the vertical position (Z-position) of the substrate table. The measurement system comprises a target surface 540 and a sensor 530, co-operating with the target.

In an embodiment, the measurement system can be an encoder based measurement system whereby the target surface 540 can e.g., be a grating and the sensor 530 comprises an encoder head for co-operating with the grating.

Note that other measurement systems as discussed above could be combined with the reluctance type actuator as shown.

Figure 5B:
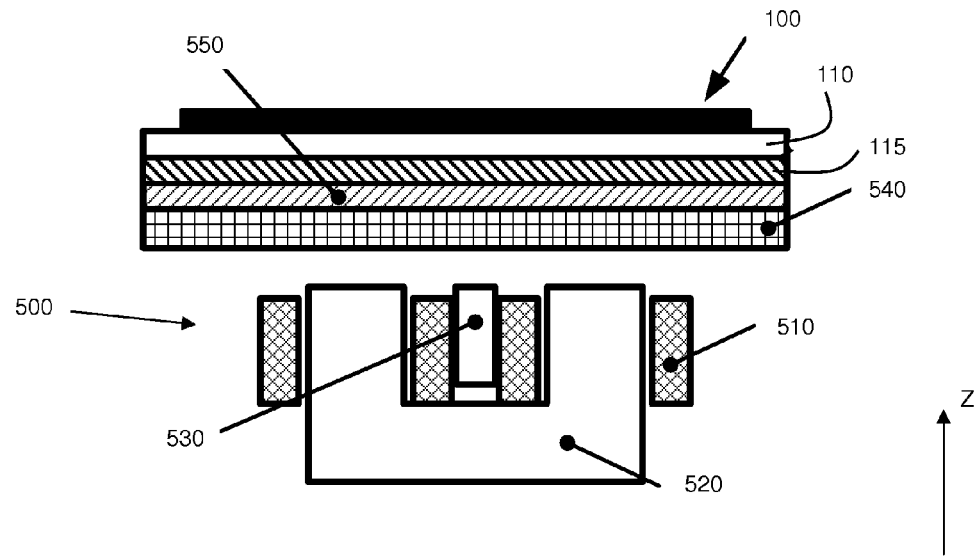
FIG. 5b depicts the embodiment of FIG. 5a, combined with a short stroke assembly.

In FIG. 5b, the same actuator arrangement of FIG. 5a is shown. In addition, FIG. 5b schematically shows a short stroke assembly 115 that is mounted to a bottom surface of the substrate stage 110. As a practical example, the short stroke assembly can comprise a magnet assembly which is mounted to the substrate table 110 and a coil assembly (not shown) co-operating with the magnet assembly for accurate positioning (e.g., in 6 degrees of freedom) of the substrate table 110 (and thus the substrate 100). As mentioned above, such short stroke assembly (also referred to as a further positioning device) can be part of the first positioning member 120 as e.g., shown in FIGS. 2 and 3.

In the arrangement as shown, the actuator 140 is thus arranged to exert a force on the substrate table via the short stroke assembly 115; i.e., by exerting a force on the short stroke assembly or further positioning device. In the arrangement as shown, the target surface 540 is mounted to a bottom surface of the short stroke assembly 115. Alternatively, the short stroke assembly 115 can be provided with an aperture (not shown) enabling a position measurement of the bottom surface of the substrate table 110, e.g., by using a measurement beam such as an interferometer measurement beam through the aperture. Note that the application of the short stroke assembly 115 may also be applied in combination with the actuator arrangements discussed below.

Figure 6:
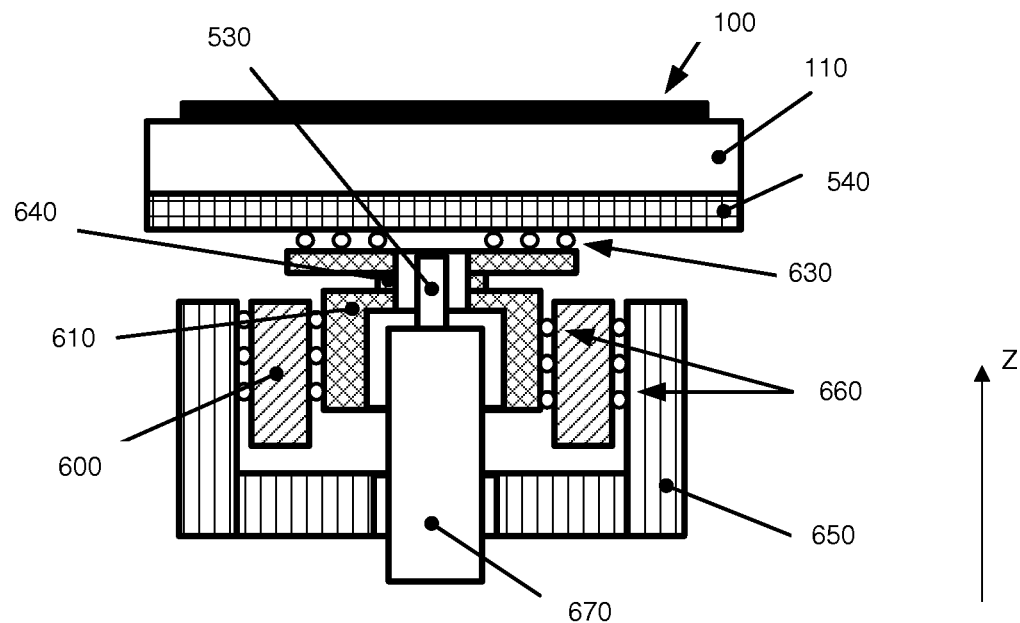
FIG. 6 depicts a second embodiment of an actuator as can be applied in a substrate stage or lithographical apparatus according to the present invention.

In FIG. 6, a first arrangement including a Lorentz type actuator is shown. In the arrangement, none of the co-operating parts of the actuator, i.e., coil 600 and magnet 610 are mounted to the substrate table 110. In the arrangement as shown, a vertical force is generated on the magnet 610, the force being transmitted to the substrate table 110 via the bearing 630, which can e.g., be a vacuum preloaded air bearing enabling a relative displacement (in the horizontal plane) between the actuator and the substrate table. In order to adapt to a tilting of the substrate table, a hinge 640 can be provided enabling a rotation of the bearing about the X-axis and/or Y-axis. In the arrangement as shown, the coil 600 is displaceably (in Z-direction) mounted on a support structure 650 using an air bearing 660. Alternatively, the coil 600 can be mounted directly or via flexible hinges to the support structure 650. In the arrangement as shown, the magnet 610 and bearing 630 are also mounted to the support structure 650 via an air bearing 660 between the coil 600 and the magnet 610. The use of the air bearings 660 between the support structure, the coil and the magnet, enables a balance-mass like operation of the magnet and coil of the actuator, thereby substantially cancelling the generated forces. By doing so, the resulting force exerted on the support structure 650 can remain small.

Similar to the arrangement of FIG. 6, a position measurement system is incorporated for determining a Z-position of the substrate table, such Z-position measurement being suited for controlling the actuator (600, 610). The measurement system comprises a target portion 540 (e.g., a grating), mounted to the substrate table 110 and a sensor 530 which is, in the embodiment shown, mounted to a support frame 670, which can e.g., be a metrology frame as discussed above.

Figure 7:
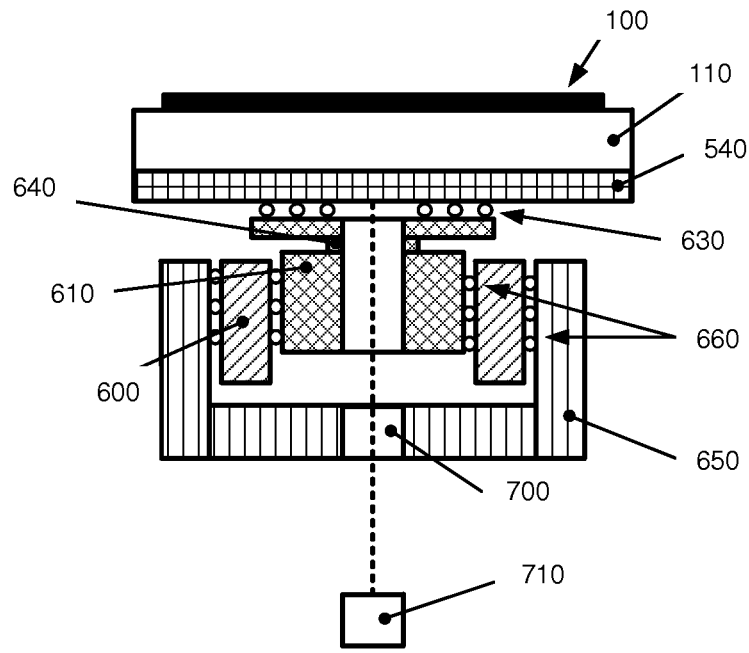
FIG. 7 depicts a third embodiment of an actuator as can be applied in a substrate stage or lithographical apparatus according to the present invention.

In FIG. 7, a similar actuator arrangement is shown but combined with an interferometer based measurement system. In FIG. 7, the actuator 600, 610 is accompanied by a position measurement system comprising a target 540 and an interferometer arranged to aim a measurement beam towards the target. In such arrangement, the target 540 can e.g., have a reflective surface. In the arrangement as shown the support structure 650 of the actuator is provided with an aperture 700 enabling the measurement beam to pass to the target surface 540.

Figure 8:
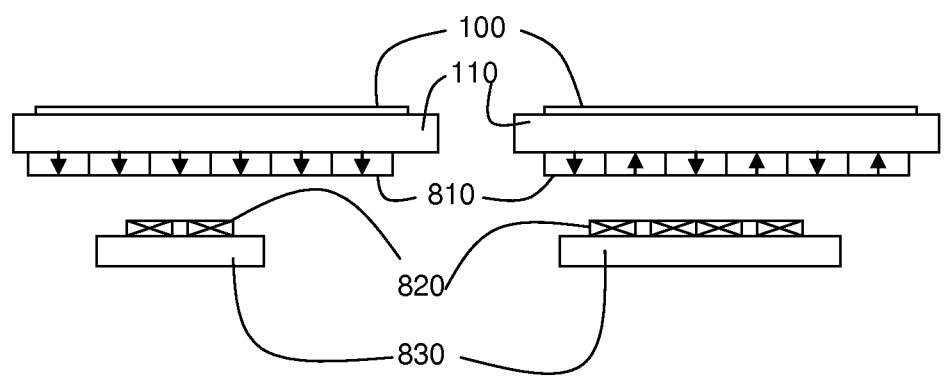
FIG. 8 depicts a fourth and fifth embodiment of an actuator as can be applied in a substrate stage or lithographical apparatus according to the present invention.

In FIG. 8, two further embodiments of Lorentz-type actuators are schematically shown, whereby a magnet array 800 is mounted at the bottom surface of the substrate table 110 holding a substrate 100.

In the arrangement on the left of FIG. 8, the magnets of the magnet array have the same polarization, in the arrangement on the right, the magnets are alternatingly polarized. In order to co-operate with the magnet array, one or more coils 820 are provided which can be mounted on a support structure 830, a metrology frame, etc. . . . , as discussed above. In the arrangement on the left, energizing the coil as shown will result in a force being generated in the vertical direction, enabling to displace the substrate table. In the arrangement on the right, due to the alternating polarization of the magnets, the direction of the generated force (for a given current in the coil or coils) will vary, depending on the relative (horizontal) position of the magnet array and the coils. As such, in the arrangement on the right, the horizontal position of the magnet array relative to the coil or coils, combined with a model of the magnetic polarization or measurement data (e.g., obtained via a calibration process providing the magnetic field strength or flux density as a function of position), should be provided as input to a control unit controlling the actuator, in order to determine the required current or currents for generating a desired vertical force. Note that, due to the alternating polarization of the magnets, it may be preferred to apply at least two separate coils (as shown on the right in FIG. 8). By appropriately selecting the currents through the different coils, one can ensure that the resulting force acting on the magnet array is a substantially vertically directed force.

In FIGS. 5-8 various types of electromagnetic actuators have been discussed to generate a force on a bottom surface of the substrate table. Note however that other types of actuators can be considered as well.

A controlled air flow towards or from the bottom surface of the substrate table may also be considered as a kind of actuation.

The bearing 630 as e.g., shown in FIGS. 6 and 7 could be positioned in vertical direction (thereby exerting a force on the substrate table) by a piezo-electric or other type of actuator.

As discussed above, the present invention enables to exert a force on a bottom surface of a substrate table at or near a point of interest, i.e., a position corresponding to a target portion of a substrate. In accordance with the present invention, this force is generated by an actuator that is in a substantially stationary position with respect to this point of interest. Such arrangement enables a more accurate actuation and position control in the point of interest. In a conventional stage apparatus, a plurality of actuators is often applied to provide in a vertical (or tilt) positioning of the substrate table and substrate. Because, due to the performed scanning or stepping process, these actuators are in general, or at least not continuously, positioned at or near the point of interest. As a consequence, using these actuators to compensate or correct a vertical position of the substrate in the point of interest, may be a rather complex operation, including a combined coordinated operation of the plurality of actuators whereby different forces may need to be generated by the available actuators. Because these actuators are generally not positioned near the point of interest, the required forces for adjusting the substrate position in the point of interest may also be comparatively high. The present invention thus provides in a more direct approach to adjust or correct the substrate's position in the point of interest compared to conventional apparatuses.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the present invention in the context of optical lithography, it will be appreciated that the present invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The descriptions above are intended to be illustrative, not limiting. Thus, it will be apparent to one skilled in the art that modifications may be made to the present invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents. The following numbered paragraphs set out particular combinations of features which are considered relevant to particular embodiments of the present disclosure.

1. A substrate stage for use in a lithographic apparatus, the substrate stage comprising:
a substrate table constructed to hold a substrate;
a positioning device for in use positioning the substrate table relative to a projection system of the lithographic apparatus, the positioning device comprising:
a first positioning member mounted to the substrate table;
a second positioning member co-operating with the first positioning member to position the substrate table; the second positioning member being mounted to a support structure; and
wherein the substrate stage further comprises an actuator, the actuator being arranged to exert a vertical force on a bottom surface of the substrate table at a substantially fixed horizontal position relative to the support structure.

2. The substrate stage according to paragraph 1, wherein the actuator is mounted on the support structure.

3. The substrate stage according to paragraph 1, wherein the actuator is mounted on the second positioning member or the first positioning member.

4. The substrate stage according to paragraph 1, wherein the actuator is displaceably mounted on the second positioning member such that it maintains a substantially fixed horizontal position relative to the support structure.

5. The substrate stage according to paragraph 1, wherein the actuator is mounted to a vibration isolated frame having a substantially fixed position relative to the support structure.

6. The substrate stage according to paragraph 2 or 3 wherein the actuator is mounted on the support structure or the second positioning member via a vibration isolator.

7. The substrate stage according to any of the preceding paragraphs wherein the actuator comprises a Lorentz actuator.

8. The substrate stage according to any of the paragraphs 1 to 6 wherein the actuator in use provides in an upwardly directed gas flow.

9. The substrate stage according to any preceding paragraph, further comprising a position measurement system for determining a vertical position of the bottom surface of the substrate table.

10. The substrate stage according to paragraph 9, further comprising a control unit, the control unit being arranged to: receive, at a input terminal, a input signal representing the vertical position and control the actuator based on the input signal.

11. A lithographical apparatus comprising a projection system and a substrate stage according to any of the preceding paragraphs.

12. A lithographic apparatus comprising:
a support constructed to support a patterning device, the patterning device being capable of imparting a radiation beam with a pattern in its cross-section to form a patterned radiation beam;
a substrate table constructed to hold a substrate; and
a projection system configured to project the patterned radiation beam onto a target portion of the substrate, wherein the apparatus further comprises a positioning device for in use positioning the substrate table relative to the projection system, the positioning device comprising:
a first positioning member mounted to the substrate table;
a second positioning member co-operating with the first positioning member to position the substrate table; the second positioning member being mounted to a support structure; and
wherein the substrate stage further comprises an actuator, the actuator being arranged to exert a vertical force on a bottom surface of the substrate table at a substantially fixed horizontal position relative to an optical axis of the projection system.

13. The apparatus according to paragraph 12, wherein the substantially fixed horizontal position is on the optical axis of the projection system.

14. The apparatus according to paragraph 12 or 13 wherein the actuator is mounted to a vibration isolated frame such as a metrology frame.

15. The apparatus according to any of the paragraphs 12 to 14 further comprising a position measurement system for measuring a first position of the substrate table in a direction of the optical axis.

16. The apparatus according to paragraph 15, wherein the position measurement system is further arranged to determine a second position of the substrate table in a direction substantially perpendicular to the optical axis.

17. The apparatus according to paragraph 16, further comprising a control unit, wherein the control unit is arranged to:
receive, at a input terminal, a first input signal representing the first position and a second input signal representing the second position;
control the actuator based on the first input signal; and
control the positioning device based on the second input signal.

18. The apparatus according to paragraph 17, wherein the position measurement system comprises a encoder grating mounted to the bottom surface of the substrate table and an encoder head mounted to a metrology frame supporting the projection system, the encoder head being arranged to co-operate with the encoder grating for determining the first and second position.

19. The apparatus according to any of the paragraphs 12 to 18, wherein the first positioning member comprises a further positioning device for positioning the substrate table.

20. The apparatus according to paragraph 19, wherein the actuator is arranged to exert the vertical force on the bottom surface by exerting a force on the further positioning device.

21. A device manufacturing method comprising
positioning a substrate relative to a projection system; and
projecting a patterned beam of radiation onto a target portion of the substrate, whereby the step of positioning the substrate comprises
providing a positioning device comprising:
a first positioning member mounted to the substrate table;
a second positioning member co-operating with the first positioning member to position the substrate table; the second positioning member being mounted to a support structure; and exerting a vertical force on a bottom surface of the substrate table at a substantially fixed horizontal position relative to an optical axis of the projection system.

22. A substrate stage for use in a lithographic apparatus, the substrate stage comprising:
a substrate table constructed to hold a substrate;
a positioning device configured to position the substrate table relative to a projection system of the lithographic apparatus, the positioning device comprising:
a first positioning member mounted to the substrate table;
a second positioning member co-operating with the first positioning member to position the substrate table, the second positioning member being mounted to a support structure; and
an actuator configured to exert a vertical force on a bottom surface of the substrate table at a substantially fixed horizontal position relative to the support structure.

23. The substrate stage according to paragraph 22, wherein the actuator is mounted on the support structure.

24. The substrate stage according to paragraph 22, wherein the actuator is mounted on the second positioning member or the first positioning member.

25. The substrate stage according to paragraph 22, wherein the actuator is displaceably mounted on the second positioning member such that it maintains a substantially fixed horizontal position relative to the support structure.

26. The substrate stage according to paragraph 22, wherein the actuator is mounted to a vibration isolated frame having a substantially fixed position relative to the support structure.

27. The substrate stage according to paragraph 23, wherein the actuator is mounted on the support structure or the second positioning member via a vibration isolator.

28. The substrate stage according to paragraph 23, wherein the actuator comprises a Lorentz actuator.

29. The substrate stage according to paragraph 22, wherein the actuator in use provides an upwardly directed gas flow.

30. The substrate stage according to paragraph 22, further comprising a position measurement system for determining a vertical position of the bottom surface of the substrate table.

31. The substrate stage according to paragraph 30, further comprising a control unit, the control unit being arranged to:
receive, at a input terminal, a input signal representing the vertical position and control the actuator based on the input signal.

32. A lithographic apparatus comprising:
a support constructed to support a patterning device, the patterning device being capable of imparting a radiation beam with a pattern in its cross-section to form a patterned radiation beam;
a substrate table constructed to hold a substrate and comprising an actuator, the actuator being arranged to exert a vertical force on a bottom surface of the substrate table at a substantially fixed horizontal position relative to an optical axis of the projection system; and
a projection system configured to project the patterned radiation beam onto a target portion of the substrate,
a positioning device for in use positioning the substrate table relative to the projection system, the positioning device comprising:
a first positioning member mounted to the substrate table; and
a second positioning member co-operating with the first positioning member to position the substrate table; the second positioning member being mounted to a support structure.

33. The apparatus according to paragraph 32, wherein the substantially fixed horizontal position is on an optical axis of the projection system.

34. The apparatus according to paragraph 32, wherein the actuator is mounted to a vibration isolated frame such as a metrology frame.

35. The apparatus according to paragraph 32, further comprising a position measurement system configured to measure a first position of the substrate table in a direction of the optical axis.

36. The apparatus according to paragraph 35, wherein the position measurement system is further arranged to determine a second position of the substrate table in a direction substantially perpendicular to the optical axis.

37. The apparatus according to paragraph 36, further comprising a control unit, wherein the control unit is arranged to:
receive, at a input terminal, a first input signal representing the first position and a second input signal representing the second position;
control the actuator based on the first input signal; and
control the positioning device based on the second input signal.

38. The apparatus according to paragraph 37, wherein the position measurement system comprises a encoder grating mounted to the bottom surface of the substrate table and an encoder head mounted to a metrology frame supporting the projection system, the encoder head being arranged to co-operate with the encoder grating for determining the first and second position.

39. The apparatus according to paragraph 32, wherein the first positioning member comprises a further positioning device for positioning the substrate table.

40. The apparatus according to paragraph 39, wherein the actuator is arranged to exert the vertical force on the bottom surface by exerting a force on the further positioning device.

41. A device manufacturing method comprising
positioning a substrate relative to a projection system; and
projecting a patterned beam of radiation onto a target portion of the substrate, whereby the positioning the substrate comprises,
providing a positioning device comprising:
a first positioning member mounted to the substrate table;
a second positioning member co-operating with the first positioning member to position the substrate table, the second positioning member being mounted to a support structure; and
exerting a vertical force on a bottom surface of the substrate table at a substantially fixed horizontal position relative to an optical axis of the projection system.

What is claimed is:

1. A substrate stage for use in a lithographic apparatus, the substrate stage comprising:
a substrate table configured to hold a substrate;
a positioner device for in use positioning the substrate table relative to a projection system of the lithographic apparatus, the positioning device comprising:
a first positioning member mounted to the substrate table; and
a second positioning member co-operating with the first positioning member to position the substrate table, the second positioning member being mounted to a support structure; and
an actuator configured to exert a vertical force on a bottom surface of the rate table at a substantially fixed horizontal position relative to the support structure.

2. The substrate stage according to claim 1, wherein the actuator is mounted on the support structure.

3. The substrate stage according to claim 1, wherein the actuator is displaceably mounted on the second positioning member such that the actuator maintains a substantially fixed horizontal position relative to the support structure.

4. The substrate stage according to claim 1, wherein the actuator is mounted to a vibration isolated frame having, a substantially fixed position relative to the support structure.

5. The substrate stage according to claim 1, wherein the actuator is mounted on the support structure or the second positioning member via a vibration isolator.

6. The substrate stage according to claim 1, wherein the actuator in use provides in an upwardly directed gas flow.

7. A lithographic apparatus comprising:
a support constructed to support a patterning device, the patterning device configured to impart a radiation beam with a pattern in its cross-section to form a patterned radiation beam;
a substrate table configured to hold a substrate;
a projection system configured to project the patterned radiation beam onto a target portion of the substrate;
a positioning device for in use positioning the substrate table relative to the projection system, the positioning device comprising:
a first positioning member mounted to the substrate table; and
a second positioning member co-operating with the first positioning member to position the substrate table the second positioning member being mounted to a support structure; and
an actuator configured to exert a vertical force on a bottom surface of the substrate table at a substantially fixed horizontal position relative to an optical axis of the projection system.

8. The apparatus according to claim 7, wherein the substantially fixed horizontal position is on the optical axis of the projection system.

9. The apparatus according to claim 7, wherein the actuator is mounted to a vibration isolated metrology frame.

10. The apparatus according to claim 7, farther comprising a position measurement system for measuring a first position of the substrate table in a direction of the optical axis.

11. The apparatus according to claim 7, wherein the first positioning member comprises a farther positioning device for positioning the substrate table.

12. A device manufacturing method comprising
positioning a substrate relative to a projection system; and
projecting a patterned beam of radiation onto a target portion of a substrate, whereby the positioning the substrate comprises
providing a positioning device comprising:
a first positioning member mounted to the substrate table; and
a second positioning member co-operating with the first positioning member to position the substrate table, the second positioning member being mounted to a support structure; and
exerting a vertical force on a bottom surface of the substrate table at a substantially fixed horizontal position relative to an optical axis of the projection system.

13. A substrate stage for use in a lithographic apparatus, the substrate stage comprising:
a substrate table configured to hold a substrate;
a positioning device configured to position the substrate table relative to a projection system of the lithographic apparatus, the positioning device comprising:
a first positioning member mounted to the substrate table;
a second positioning member co-operating with the first positioning member to position the substrate table, the second positioning member being mounted to a support structure; and
an actuator configured to exert a vertical force on a bottom surface of the substrate table at a substantially fixed horizontal position relative to the support structure, wherein the actuator is mounted on the second positioning member or the first positioning member.

14. A lithographic apparatus comprising:
a support constructed to support a patterning device, the patterning device configured to impart a radiation beam with a pattern in its cross-section to form a patterned radiation beam;
a substrate table configured to hold a substrate;
a projection system configured to project the patterned radiation beam onto a target portion of the substrate,
a positioning device for in use positioning the substrate table relative to the projection system, the positioning device comprising:
   a first positioning member mounted to the substrate table; and
   a second positioning member co-operating with the first positioning member to position the substrate table, the second positioning member being mounted to a support structure; and
an actuator configured to exert a vertical force on a bottom surface of the substrate table at a substantially fixed horizontal position relative to an optical axis of the projection system, wherein the actuator is mounted on the support structure or the second positioning member via a vibration isolator.

15. The apparatus according to claim 14, wherein the substantially fixed horizontal position is on the optical axis of the projection system.

* * * * *

UNITED STATES PATENT AND TRADEMARK OFFICE
CERTIFICATE OF CORRECTION

| | |
|---|---|
| PATENT NO. | : 9,261,798 B2 |
| APPLICATION NO. | : 13/871328 |
| DATED | : February 16, 2016 |
| INVENTOR(S) | : Huang et al. |

Page 1 of 1

It is certified that error appears in the above-identified patent and that said Letters Patent is hereby corrected as shown below:

In the claims,
In column 17, line 42, please delete "positioner" and insert --positioning--.
In column 17, line 52, please delete "rate" and insert --substrate--.
In column 18, line 28, please delete "farther" and insert --further--.

Signed and Sealed this
Ninth Day of August, 2016

Michelle K. Lee
*Director of the United States Patent and Trademark Office*